(12) United States Patent
Oscarsson

(10) Patent No.: US 10,539,694 B2
(45) Date of Patent: Jan. 21, 2020

(54) PIEZOELECTRIC BENDER WITH ADDITIONAL CONSTRUCTIVE RESONANCE

(71) Applicant: PGS Geophysical AS, Lilleaker, Oslo (NO)

(72) Inventor: Mattias Dan Christian Oscarsson, Oslo (NO)

(73) Assignee: PGS Geophysical AS, Oslo (NO)

( * ) Notice: Subject to any disclaimer, the term of this patent is extended or adjusted under 35 U.S.C. 154(b) by 462 days.

(21) Appl. No.: 15/332,895

(22) Filed: Oct. 24, 2016

(65) Prior Publication Data

US 2017/0038488 A1 Feb. 9, 2017

Related U.S. Application Data

(63) Continuation of application No. 14/104,790, filed on Dec. 12, 2013, now Pat. No. 9,508,915.

(60) Provisional application No. 61/873,106, filed on Sep. 3, 2013.

(51) Int. Cl.
| | |
|---|---|
| *G01V 1/00* | (2006.01) |
| *G01V 1/02* | (2006.01) |
| *G01V 1/38* | (2006.01) |
| *G01V 1/16* | (2006.01) |
| *H01L 41/053* | (2006.01) |

(52) U.S. Cl.
CPC ............... *G01V 1/159* (2013.01); *G01V 1/16* (2013.01); *G01V 1/38* (2013.01); *H01L 41/0536* (2013.01)

(58) Field of Classification Search
CPC .................................. G01V 1/04; G01V 1/16
See application file for complete search history.

(56) References Cited

U.S. PATENT DOCUMENTS

| | | |
|---|---|---|
| 3,636,469 A | 1/1972 | Reefman |
| 4,709,361 A | 11/1987 | Dahlstrom et al. |
| 5,225,731 A | 7/1993 | Owen |
| 5,646,380 A | 7/1997 | Vaage |
| 5,959,939 A | 9/1999 | Tengham et al. |
| 6,085,862 A | 7/2000 | Tenghamn |
| 7,551,518 B1 | 6/2009 | Tenghamn |
| 7,881,158 B2 | 2/2011 | Tenghamn |
| 7,974,152 B2 | 7/2011 | Tenghamn |
| 8,139,443 B2 | 3/2012 | Armstrong |
| 8,427,901 B2 | 4/2013 | Lunde et al. |
| 8,446,798 B2 | 5/2013 | Tenghamn |
| 9,508,915 B2 | 11/2016 | Oscarsson |
| 2004/0143200 A1 | 7/2004 | Nogami |
| 2006/0133199 A1 | 6/2006 | Tenghamn |
| 2007/0206441 A1 | 9/2007 | Porzio |
| 2008/0008047 A1 | 1/2008 | Lunder |
| 2008/0106172 A1 | 5/2008 | Tanaya |
| 2009/0086574 A1 | 4/2009 | Scott et al. |
| 2009/0268554 A1 | 10/2009 | Armstrong |
| 2010/0301954 A1 | 12/2010 | Fukuda |

(Continued)

OTHER PUBLICATIONS

USPTO Office Action from U.S. Appl. No. 14/104,790 dated Apr. 15, 2016.

*Primary Examiner* — Hovhannes Baghdasaryan

(57) ABSTRACT

Embodiments related to a sound source that comprises a base plate configured to bend and generate acoustic energy; a spring coupled to the base plate; and a mass element coupled to the spring, wherein the sound source is operable to produce at least two resonance frequencies in the sound source.

21 Claims, 9 Drawing Sheets

(56) References Cited

U.S. PATENT DOCUMENTS

| | | |
|---|---|---|
| 2010/0322028 A1 | 12/2010 | Tenghamn |
| 2010/0327994 A1* | 12/2010 | Choy ................ H03H 9/02118 |
| | | 333/187 |
| 2011/0120843 A1 | 2/2011 | Wunnicke |
| 2011/0148547 A1* | 6/2011 | Zhang ................ H03H 9/02118 |
| | | 333/187 |
| 2012/0291547 A1 | 11/2012 | Kim |
| 2013/0039149 A1 | 2/2013 | Tenghamn et al. |
| 2013/0044565 A1 | 2/2013 | Barr et al. |
| 2014/0125203 A1* | 5/2014 | Choy ................ H03H 9/02118 |
| | | 310/365 |

* cited by examiner

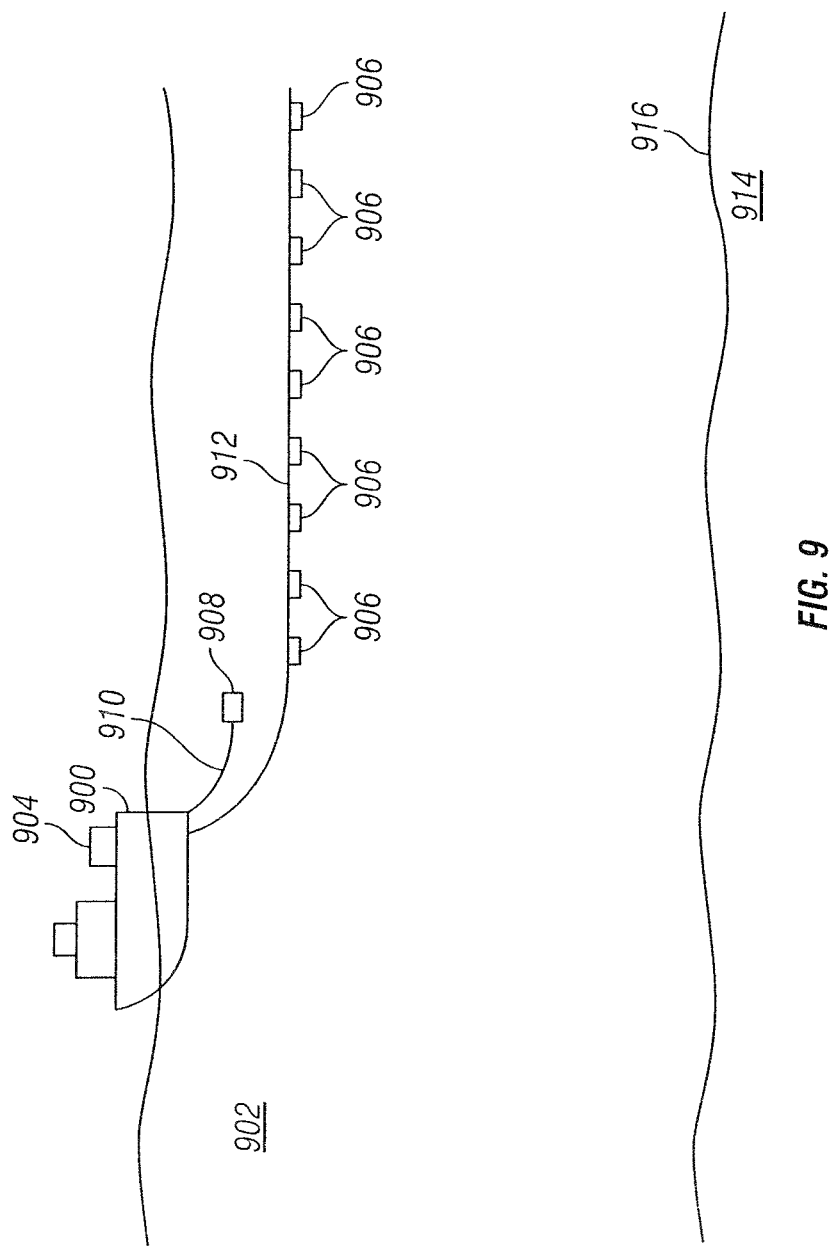

PIEZOELECTRIC BENDER WITH ADDITIONAL CONSTRUCTIVE RESONANCE

CROSS-REFERENCE TO RELATED APPLICATIONS

The present application is a continuation of U.S. patent Ser. No. 14/104,790, filed Dec. 12, 2013, entitled "Piezoelectric Bender With Additional Constructive Resonance," which claims the benefit of U.S. Provisional Application No. 61/873,106, filed Sep. 3, 2013, entitled "Piezoelectric Bender With Additional Constructive Resonance," the entire disclosures of which are incorporated herein by reference.

BACKGROUND

Embodiments relate generally to marine vibrators for marine geophysical surveys. More particularly, embodiments relate to a piezoelectric bender that comprises a spring and mass element to provide additional constructive resonance.

Sound sources are generally devices that generate acoustic energy. One use of sound sources is in marine seismic surveying in which the sound sources may be employed to generate acoustic energy that travels downwardly through water and into subsurface rock. After interacting with the subsurface rock, e.g., at boundaries between different subsurface layers, some of the acoustic energy may be returned toward the water surface and detected by specialized sensors (e.g., hydrophones, geophones, etc.). The detected energy may be used to infer certain properties of the subsurface rock, such as structure, mineral composition and fluid content, thereby providing information useful in the recovery of hydrocarbons.

One example of a sound source includes a bender as the active part. This type of sound source is typically referred to as a "piezoelectric bender" because it uses the piezoelectric effect to generate acoustic energy. A piezoelectric bender may include a base plate of elastic material (e.g., aluminum) and a piezoelectric body attached to the base plate. When an electrical field is applied across the composite assembly of the base plate and the piezoelectric body, the composite assembly should bend and thus create vibrations from the composite assembly to a fluid (e.g., water). The piezoelectric bender may have a first resonance frequency as a result of the composite assembly functioning as a spring, together with the surrounding oscillating water mass.

FIG. 1 shows a finite-element analysis of an axial-symmetric model of a piezoelectric bender 100 working close to its first resonance. As illustrated, the piezoelectric bender 100 may comprise a base plate 105 and piezoelectric body 110, which may bend from a first position to a second position shown at 105' and 110', respectively. The axial line of symmetry for the piezoelectric bender 100 is represented by reference number 102. FIG. 2 is a graph showing an example of far-field intensity as a function of frequency for the piezoelectric bender 100 of FIG. 1. As illustrated by FIG. 2, the piezoelectric bender 100 may have a sharp resonance peak, causing the bandwith of this design to be limited.

BRIEF DESCRIPTION OF THE DRAWINGS

These drawings illustrate certain aspects of some of the embodiments of the present invention and should not be used to limit or define the invention.

FIG. 9 shows an example embodiment of a marine seismic survey system using a piezoelectric bender.

DETAILED DESCRIPTION

It is to be understood that the present disclosure is not limited to particular devices or methods, which may, of course, vary. It is also to be understood that the terminology used herein is for the purpose of describing particular embodiments only, and is not intended to be limiting. All numbers and ranges disclosed herein may vary by some amount. Whenever a numerical range with a lower limit and an upper limit is disclosed, any number and any included range falling within the range are specifically disclosed. Although individual embodiments are discussed, the invention covers all combinations of all those embodiments. As used herein, the singular forms "a", "an", and "the" include singular and plural referents unless the content clearly dictates otherwise. Furthermore, the word "may" is used throughout this application in a permissive sense (i.e., having the potential to, being able to), not in a mandatory sense (i.e., must). The term "include," and derivations thereof, mean "including, but not limited to." The term "coupled" means directly or indirectly connected. If there is any conflict in the usages of a word or term in this specification and one or more patent or other documents that may be incorporated herein by reference, the definitions that are consistent with this specification should be adopted for the purposes of understanding this invention.

Figure 1:
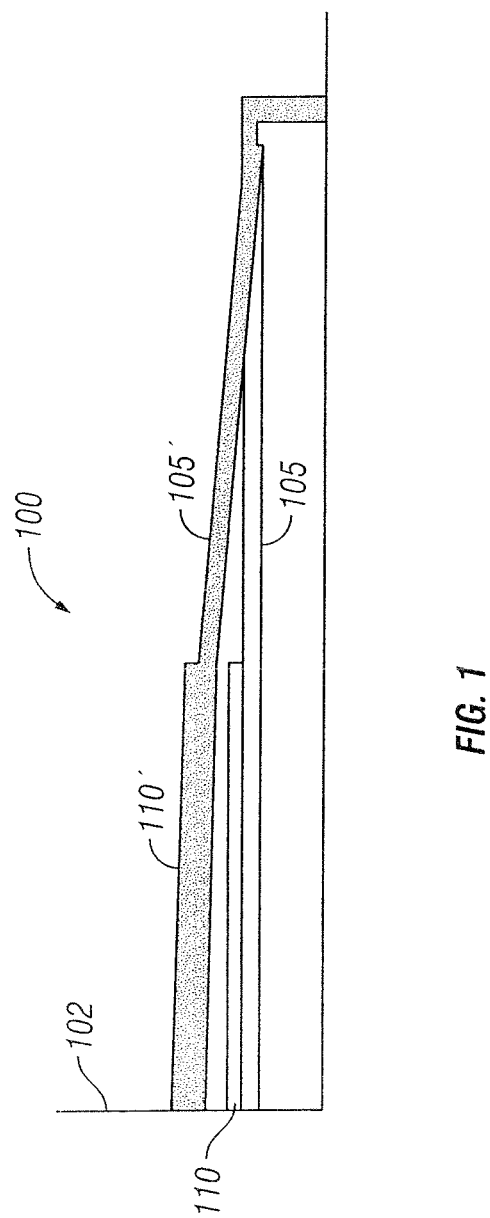
FIG. 1 shows an axial-symmetric model of an example piezoelectric bender.
Figure 2:
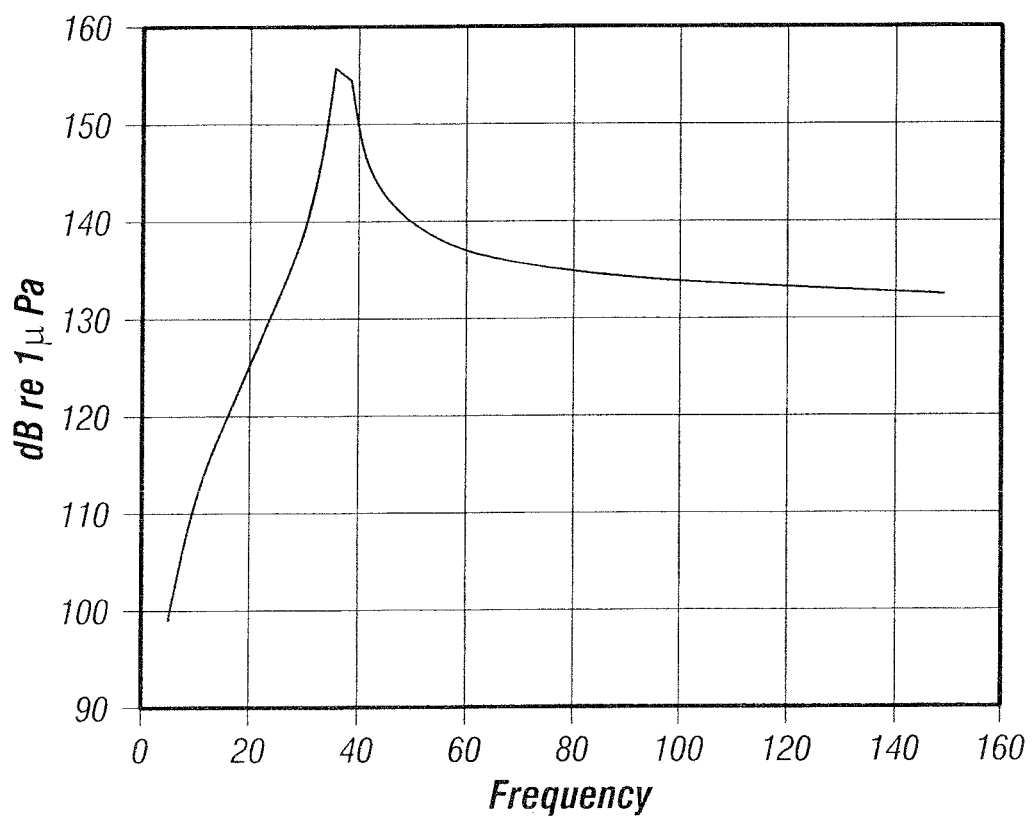
FIG. 2 shows a graph showing far-field intensity as a function of frequency for an example piezoelectric bender with one resonance frequency.
Figure 3:
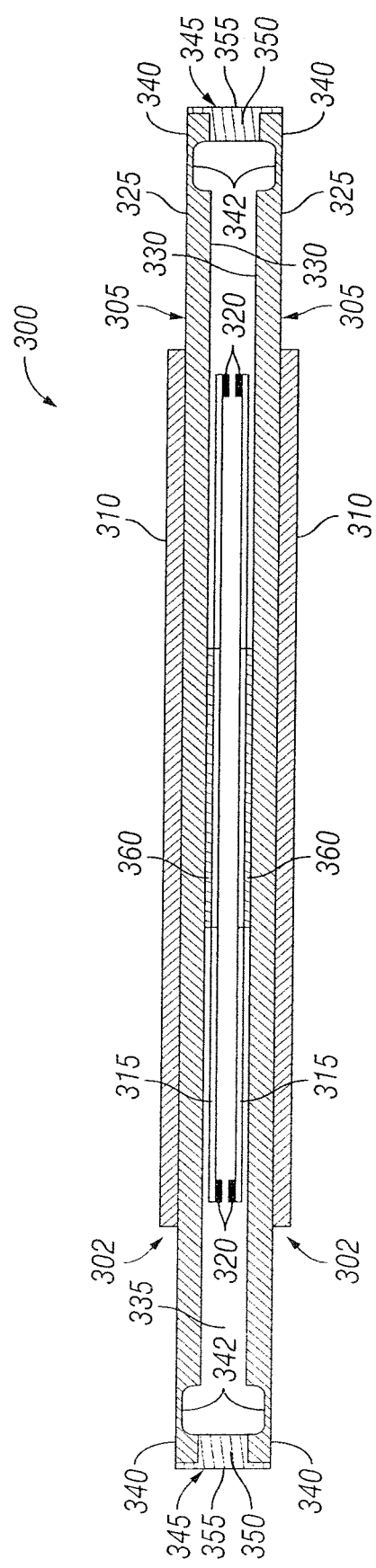
FIG. 3 shows a cross-sectional view of an embodiment of a piezoelectric bender that comprises a spring and mass element.
Figure 4:
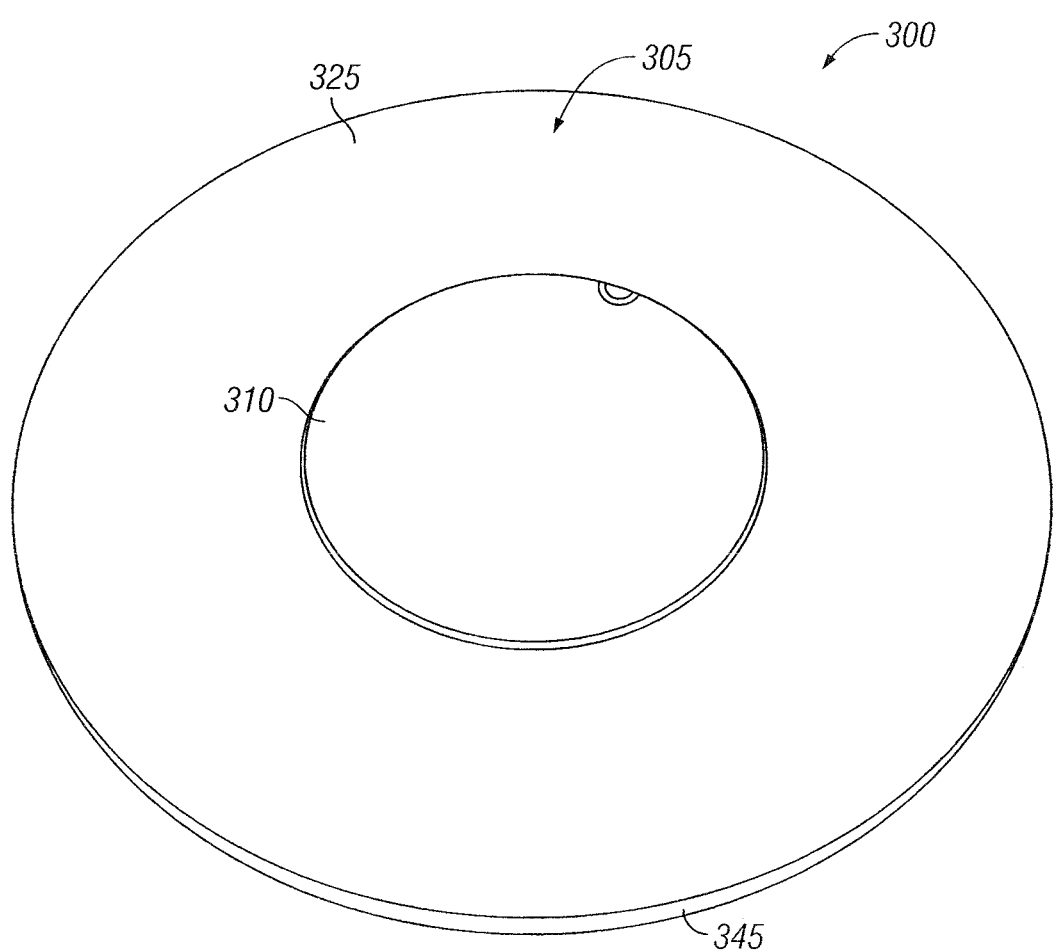
FIG. 4 shows a top view of the example piezoelectric bender of FIG. 3.

FIGS. 3 and 4 illustrate an embodiment of a piezoelectric bender 300. As illustrated, the piezoelectric bender 300 comprises base plates 305 and piezoelectric bodies 310 attached to the base plates 305. Each of the base plates and piezoelectric bodies 310 may form a corresponding composite assembly 302. To provide the additional constructive resonance, the piezoelectric bender 300 further comprises springs 315 with mass elements 320 attached to the springs 315, as seen in FIG. 3. In particular, the springs 315 and mass elements 320 may be included in the piezoelectric bender 300 to provide a second resonance frequency within the frequency range of interest.

The base plates 305 may each comprise an outer surface 325 and an inner surface 330. In the illustrated embodiment, the base plates 305 are spaced to provide a gap 335 between the respective inner surfaces 330. The gap 335 may be filled with air in some embodiments. In alternative embodiments, the gap 335 may be a vacuum. The gap 335 may be sized to permit flexing and bending of the base plates 305 and springs 315 without interference with one another. As illustrated, the base plates 305 may be generally planar. In some embodiments, the base plates 305 may be in the form of a flexible disk, as best seem on FIG. 4. In embodiments, the base plates 305 may each be a flat, circular disk having substantially uniform thickness. However, other configurations, including both axially-symmetric and not, of the base plates 305 may be suitable for particular applications. By way of example, the base plates 305 may be rectangular, square, elliptical, or other suitable shape for providing the desired acoustic energy. The base plates 305 may comprise spring steel, aluminum, a copper alloy, glass-fiber reinforced plastic (e.g., glass-fiber reinforced epoxy), carbon fiber reinforced or other suitable flexible spring material. Examples of suitable copper alloys may include glass-fiber reinforced epoxy, brass, beryllium, copper, phosphor bronze, or other suitable copper alloy. In some embodiments, the base plates 305 may comprise spring steel. In particular embodiments, the base plates 305 may have a thickness from about 1 millimeters to about 8 millimeters. In general, the base plates 305 should have a thickness that allows sufficient deformation but withstand expected pressures.

Figure 5:
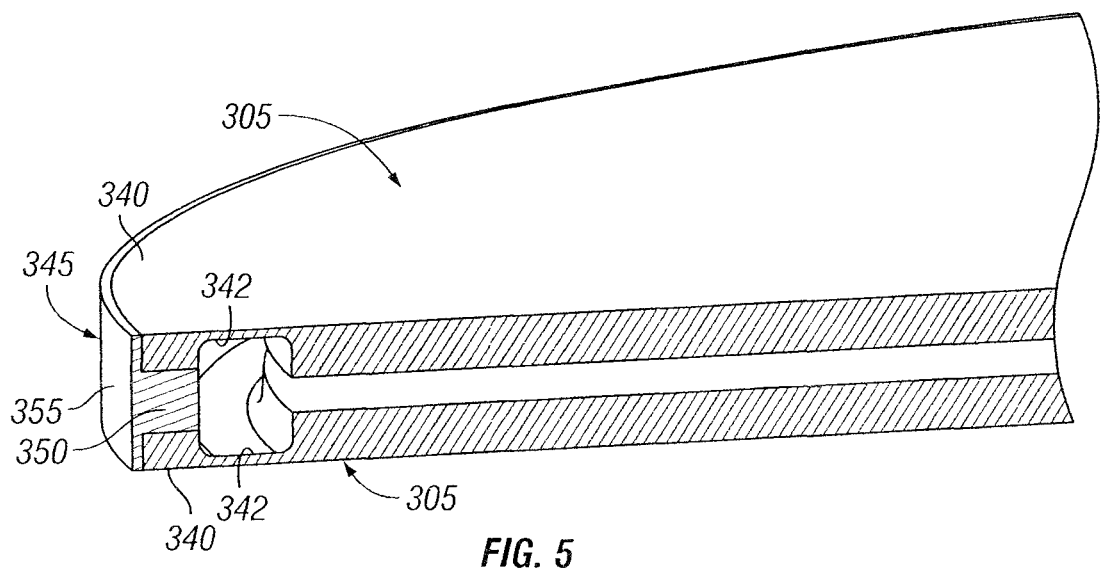
FIG. 5 shows a close-up of the cross-sectional view of FIG. 3 showing the edge of the example piezoelectric bender.

With additional reference to FIG. 5, the base plates 305 may be secured to another in a manner that allows the base plates 305 to bend and create the desired acoustic energy. In particular embodiments, the base plates 305 may be coupled to one another at their outer edges 340. In the illustrated embodiment, the outer edges 340 may include an area of reduced thickness referenced on FIGS. 3 and 5 by numeral 342, which functions to facilitate bending and flexing of the base plates 305. As illustrated, the piezoelectric bender 300 may further comprise a ring 345, for example, that couples the base plates 305 to one another at their outer edges 340 In the illustrated embodiment, the ring 345 may include an inner extension 350 that extends from ring body 355 between the outer edges 345 of the base plates 305. The ring 345 may be coupled to the base plates 305 by soldering or other suitable coupling technique, such as use of an adhesive or fasteners (e.g., screws). While the ring 345 is shown for securing the base plates 305 to one another, other suitable techniques may be used to secure the base plates 305. For example, the base plates 305 may be configured so that the outer edges 345 overlap without the need for the ring 345.

As illustrated in FIGS. 3-5, the piezoelectric bodies 310 may each be coupled to the outer surfaces 325 of the base plates 305. The piezoelectric bodies 310 may include a piezoelectric ceramic material. Examples of suitable piezoelectric ceramic materials include barium titanate, lead zirconate, lead titanate, and combinations thereof. Piezoelectric crystals may also be used, in some embodiments, which may include gallium phosphate, quartz, tourmaline, and combinations thereof. As illustrated, the piezoelectric bodies 310 may be generally planar. In some embodiments, the piezoelectric bodies 310 may be in the form of a disk, as best seem on FIG. 4. In embodiments, the piezoelectric bodies 310 may each be a flat, circular disk having substantially uniform thickness. However, other configurations of the piezoelectric bodies 310 may be suitable for particular applications. By way of example, the piezoelectric bodies 310 may be rectangular, square, elliptical, or other suitable shape for providing the desired acoustic energy. In particular embodiments, the piezoelectric bodies 310 may have a thickness from about 2 millimeters to about 5 millimeters. In general, the piezoelectric bodies 310 should have a thickness that allows sufficient deformation but withstand expected pressures. In particular embodiments, the piezoelectric bodies 310 may be coupled to the base plates 305 by use of an adhesive material, such as an electrically conductive epoxy.

While not illustrated, electrical connections may be made to the base plates 305 and piezoelectric bodies 310. For example, an electrical connection may be made to each of the base plates 305, and another electrical connection may be made to each of the piezoelectric bodies 310. Voltage may be applied across the electrical connections so that the applied electrical field results in a mechanical strain in the piezoelectric bodies 310 with resultant blending and flexing of the composite assemblies 302 to generate acoustic energy.

Referring to FIG. 3, the piezoelectric bender 300 may comprise springs 315 with mass elements 320 attached to the springs 315. As previously mentioned, the springs 315 and mass elements 320 may be included in the piezoelectric bender 300 to provide a second resonance frequency within the frequency range of interest. The properties of the springs 315 and the mass elements 320 (e.g., stiffness, size, position, mass, etc.) can be chosen to achieve a specific and desired second resonance frequency. As illustrated, the springs 315 and the mass elements 320, in some embodiments, may be disposed in the interior of the piezoelectric bender 300. For example, the springs 315 and mass elements 320 may be located in the gap 335 between the base plates 305. In other embodiments, the springs 315 and the mass elements 325 may be located elsewhere, for example, they may be located external to the piezoelectric bender 300.

The springs 315 may be generally planar and comprise spring steel, aluminum, a copper alloy, glass-fiber reinforced plastic (e.g., glass-fiber reinforced epoxy), carbon fiber reinforced or other suitable flexible spring material. Examples of suitable copper alloys may include glass-fiber reinforced epoxy, brass, beryllium, copper, phosphor bronze, or other suitable copper alloy Suitable flexible spring materials may have a high yield strength and not permanently deform when caused to deform and flex by action of the piezoelectric bodies 310. In some embodiments, the springs 315 may each be a class V flextensional transducer. In some embodiments, the springs 315 may each be in the form of a disk. In particular embodiments, the springs 315 may each be a flat, circular disk having substantially uniform thickness. However, other configurations of the springs 315 may be suitable for particular applications. By way of example, the springs 315 may be rectangular, square, elliptical, or other suitable shape for providing the desired acoustic energy. In particular embodiments, the springs 315 may have a thickness from about 0.1 millimeters to about 3 millimeters. In general, the springs 315 should have a thickness that allows sufficient deformation but withstand expected pressures.

The springs 315 may be coupled to the inner surfaces 330 of the base plates 305. In the illustrated embodiment, the springs 315 may be indirectly coupled to the base plates 305 with a spacer 360 disposed between each of the springs 315 and the corresponding one of the base plates 305. The spacers 360 may be sized to provide sufficient space between the base plates 305 and springs 315 for clearance when flexing and bending occurs. In some embodiments, the spacers 360 may each be in the form of a disk. In other embodiments, the spacers 360 may be rectangular, square, circular, elliptical, or other suitable shape. In some embodiments, each spacer 360 may be integrally formed with the corresponding one of the base plates 305.

The mass elements 320 may be attached to the springs 315. In the illustrated embodiments, the mass elements 320 may be attached at the perimeter of the springs 315. In particular embodiment, the mass elements 320 may be in the form of an annular-plate that adds weight to the perimeters of the springs 315. However, other configurations of the mass elements 320 may be suitable for particular applications. For example, the mass elements 320 may be in the form of blocks, bars, or other suitable shapes. In embodiments, the piezoelectric bender 300 may comprise a pair of mass elements 320 wherein a single one of the mass elements 320 may be added to each of the springs 315. In other embodiments, two or more mass elements 320 may be added to each of the springs.

Accordingly, because the springs 315 and mass elements 320 may provide additional constructive resonance, the piezoelectric bender 300 may display at least two resonance frequencies when submerged in water. One of the resonance frequencies may result from interaction of the composite assemblies 302 of the base plates 305 and piezoelectric bodies 310 functioning as springs, together with the surrounding oscillating water mass. Another of the resonance frequencies may result from vibration of the springs 315 due to interaction with the base plates 305. For example, the piezoelectric bender 300 may display two or more resonance frequencies within a seismic frequency band, typically a range between about 1 Hz and about 300 Hz. In some embodiments, the piezoelectric bender 300 may display two more resonance frequencies between about 1 Hz to about 200 Hz. In alternative embodiments, the piezoelectric bender 300 may display two or more resonance frequencies between about 0.1 Hz and about 100 Hz, alternatively, between about 0.1 Hz and about 10 Hz, and alternatively, between about 0.1 Hz and about 5 Hz. In particular embodiments, piezoelectric bender 300 may display a first resonance frequency between about 3 Hz to about 8 Hz and one or more additional resonance frequencies from about 8 Hz to about 24 Hz and, alternatively, from about 24 Hz to about 72 Hz.

Figure 6:
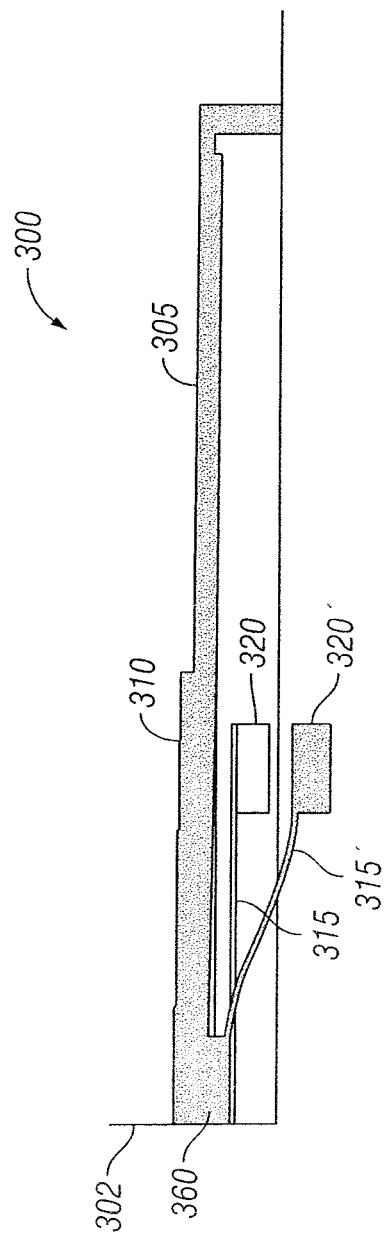
FIG. 6 shows an axial-symmetric model of an embodiment of a piezoelectric bender that comprises a spring and mass element.

Referring to FIG. 6, a finite-element analysis of an axial-symmetric model of the piezoelectric bender 300 of FIG. 3 is shown with additional constructive resonance. As illustrated, the piezoelectric bender 300 may comprise a base plate 305 and piezoelectric body 310, which may bend from a first position to a second position. As further illustrated, a spring 315 with mass element 320 may be coupled to the base plate 305 via spacer 360. The spring 315 with mass element 320 may bend from a first position to a second position shown at 315' and 320', respectively. The axial line of symmetry for the piezoelectric bender 300 is represented by reference number 302.

Figure 7:
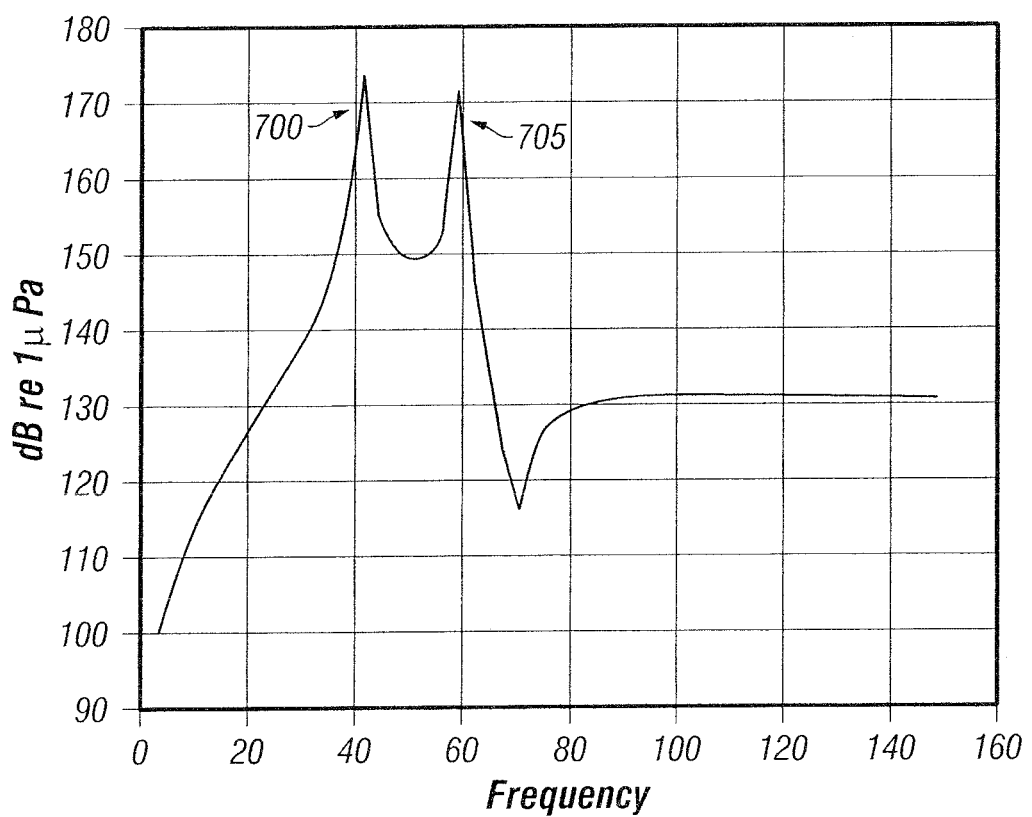
FIG. 7 shows a graph showing far-field intensity as a function of frequency for an example piezoelectric bender with a second resonance frequency.

FIG. 7 is a graph showing the results of a finite-element simulation for a piezoelectric bender having additional constructive resonance. The simulation was performed for a piezoelectric bender similar to the piezoelectric bender 300 shown on FIG. 3. On FIG. 7, far-field intensity is shown as a function of frequency. As illustrated, the piezoelectric bender exhibits a first resonance frequency 700 at 40 Hz and a second resonance frequency 705 at 60 Hz. The second resonance frequency 705 may be due to the additional constructive resonance provided by the inclusion of springs and mass elements (such as springs 315 and mass elements 320 shown on FIG. 3). The additional constructive resonance can increase the bandwith of the piezoelectric bender.

Figure 8:
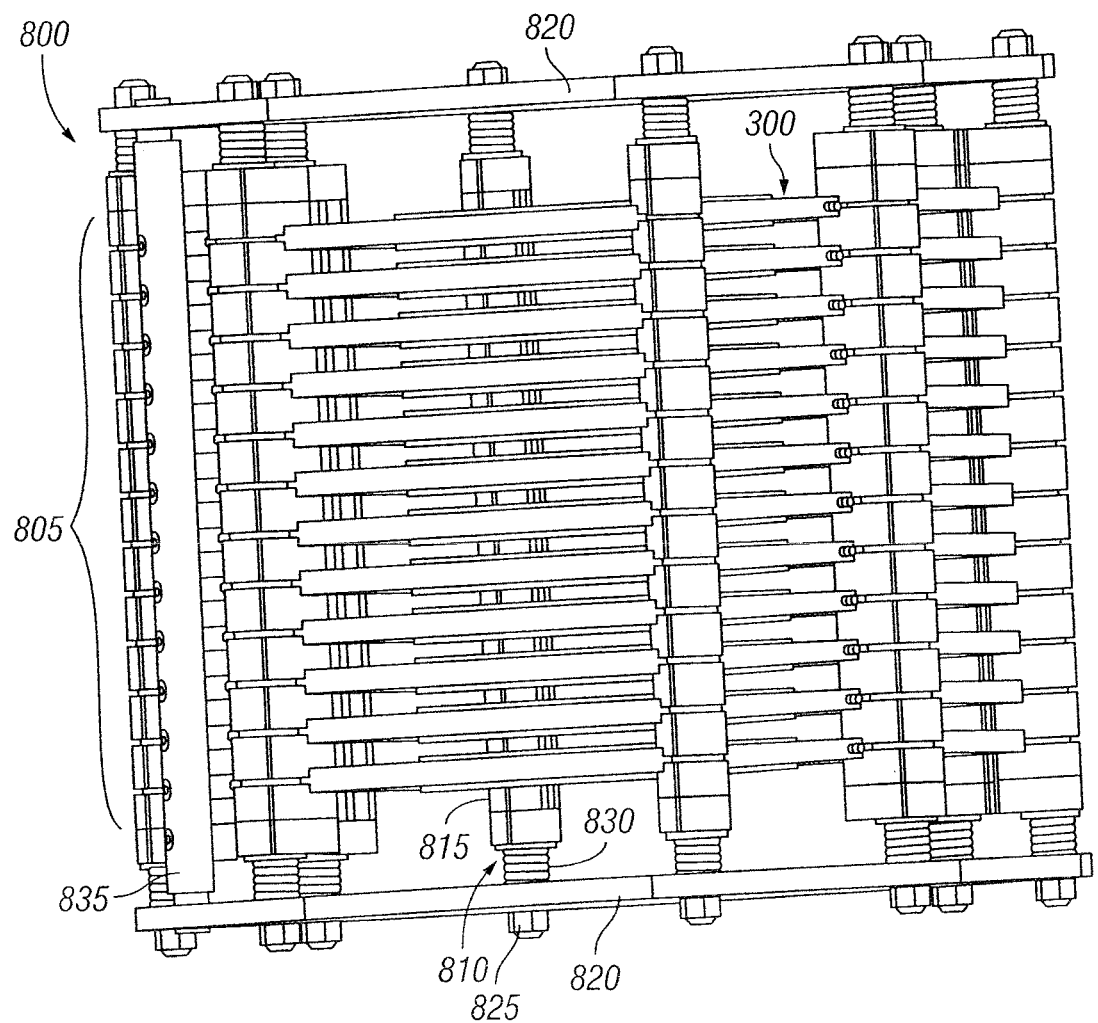
FIG. 8 shows a side view of an embodiment of an assembly of piezoelectric benders arranged in a stack.

FIG. 8 illustrates a bender assembly 800 in accordance with particular embodiments. As illustrated, the bender assembly 800 may comprise a plurality of piezoelectric benders 300 arranged in a stack 805. The piezoelectric benders 300 in the stack 805 may be similar in construction to the embodiment illustrated in FIGS. 3-5. In FIG. 8, twelve piezoelectric benders 300 are shown arranged in a single stack 805. It should be noted that, in some embodiments, the stack 805 may include more (or less) piezoelectric benders 300 than shown. Moreover, while not shown, the bender assembly 800 may include two or more stacks 805 of piezoelectric benders 300 in some embodiments.

The bender assembly 800 may further comprise a plurality of rods 810 which may have their axes aligned with the axis of the stack 805. Spacers 815 may be disposed on the rods 810 to maintain a desired axial separation of the piezoelectric benders 300 in the stack 805. The illustrated embodiment contains eight rods 810; however, particular embodiments may comprise more (or less) than eight rods 810 as desired for a particular application. The number, size, and spacing of the rods 810 and spacers 815 may depend on a number of factors, including the size and number of the piezoelectric benders 300. A pair of plates 820 may be disposed on either end of the rods 810. The plates 820 may hold the rods at pre-determined intervals. Nuts 825 or other suitable fastening means may be used to secure the rods 810 to the plates 820. Springs 830 may be disposed on the ends of the rods 810. The bender assembly 800 may further comprise a manifold 835 for a pressure-compensating system, which may be coupled to each of the benders 300 with a short pipe. The pressure-compensating system may function to protect the benders 300 from the hydrostatic pressure. While not illustrated, the manifold 835 may be coupled to a vessel which as the same pressure as the surrounding water.

FIG. 9 illustrates an example technique for acquiring marine seismic data that can be used with embodiments of the present techniques. In the illustrated embodiment, a survey vessel 900 moves along the surface of a body of water 902, such as a lake or ocean. The survey vessel 900 may include thereon equipment, shown generally at 904 and collectively referred to herein as a "recording system." The recording system 904 may include devices (none shown separately) for detecting and making a time indexed record of signals generated by each of seismic sensors 906 (explained further below), and for actuating a marine vibrator 908 comprising a piezoelectric bender 300 (e.g., shown on FIGS. 2-5) at selected times. The recording system 904 may also include devices (none shown separately) for determining the geodetic position of the survey vessel 904 and the various seismic sensors 906.

As illustrated, the survey vessel 900 (or a different vessel) may tow the marine vibrator 908 in the body of water 902. A source cable 910 may couple the marine vibrator 908 to the survey vessel 900. The marine vibrator 908 may be towed in the body of water 902 at a depth ranging from 0 meters to about 120 meters, for example. While not shown separately on FIG. 9, it is contemplated that embodiments of the marine vibrator 908 may include more than one piezoelectric bender 300 towed by the survey vessel 900 or a different vessel. In some embodiments, one or more arrays of piezoelectric benders 300 may be used. For example, at least one bender assembly 800 shown on FIG. 8 may be towed by the survey vessel 900. At selected times, the marine vibrator 908 may be triggered, for example, by the recording system 904, to generate acoustic energy.

The survey vessel 900 (or a different vessel) may further tow at least one sensor streamer 912 to detect the acoustic energy that originated from the marine vibrator 908 after it has interacted, for example, with rock formations 914 below the water bottom 916. As illustrated, both the marine vibrator 908 and the sensor streamer 912 may be towed above the water bottom 916. The seismic streamer 912 may contain seismic sensors 906 thereon at spaced apart locations. In some embodiments, more than one sensor streamer 912 may be towed by the survey vessel 900, which may be spaced apart laterally, vertically, or both laterally and vertically. While not shown, some seismic surveys locate seismic sensors 906 on ocean bottom cables or nodes in addition to, or instead of, a sensor streamer 912. The seismic sensors 906 may be any type of seismic sensors known in the art, including hydrophones, geophones, particle velocity sensors, particle displacement sensors, particle acceleration sensors, or pressure gradient sensors, for example. By way of example, the seismic sensors 906 may generate response signals, such as electrical or optical signals, in response to detected acoustic energy. Signals generated by the seismic sensors 906 may be communicated to the recording system 904. The detected energy may be used to infer certain properties of the subsurface rock, such as structure, mineral composition and fluid content, thereby providing information useful in the recovery of hydrocarbons.

In accordance with an embodiment of the invention, a geophysical data product indicative of certain properties of the subsurface rock may be produced from the detected energy. The geophysical data product may include processed seismic geophysical data and may be stored on a non-transitory, tangible computer-readable medium. The geophysical data product may be produced offshore (i.e. by equipment on a vessel) or onshore (i.e. at a facility on land) either within the United States or in another country. If the geophysical data product is produced offshore or in another country, it may be imported onshore to a facility in the United States. Once onshore in the United States, geophysical analysis may be performed on the data product.

The foregoing figures and discussion are not intended to include all features of the present techniques to accommodate a buyer or seller, or to describe the system, nor is such figures and discussion limiting but exemplary and in the spirit of the present techniques.

What is claimed is:

1. A sound source comprising:
   a base plate configured to bend and generate acoustic energy;
   a spring coupled to the base plate; and
   a mass element coupled to the spring, wherein the sound source is operable to produce at least two resonance frequencies in the sound source, wherein at least one of the two resonance frequencies is about 10 Hz or lower at a depth of the sound source in a body of water of from about 0 meters to about 120 meters.

2. The sound source of claim 1, wherein the base plate comprises a flexible disk.

3. The sound source of claim 1, wherein the base plate comprises at least one material selected from the group consisting of spring steel, aluminum, copper alloy, glass-fiber reinforced plastic, carbon-fiber reinforced plastic, and combinations there.

4. The sound source of claim 1, further comprising a spacer disposed between the spring and the base plate, such that the spring is indirectly coupled to the base plate.

5. The sound source of claim 4, wherein the spacer comprises a disk, wherein the spring comprises a disk, and wherein the mass element comprises an annular disk coupled at a perimeter of the spring.

6. The sound source of claim 1, wherein the spring comprises a disk, wherein the mass element comprises an annular disk coupled at a perimeter of the spring.

7. The sound source of claim 1, further comprising a piezoelectric body coupled to the base plate.

8. A sound source comprising:
   a pair of flexible base plates configured to bend and generate acoustic energy, wherein the pair of flexible base plates are spaced to provide a gap between their respective inner surfaces, wherein each of the pair of flexible base plates comprises:
   a spring coupled to an inner surface of the corresponding one of the pair of flexible base plates; and
   a mass element coupled to the spring, wherein the spring and the mass element are located in the gap between the pair of flexible base plates, wherein the sound source is operable to produce at least two resonance frequencies between about 1 Hz and about 100 Hz at a depth in a body of water of about 0 meters to about 120 meters.

9. The sound source of claim 8, wherein at least one of the pair of flexible base plates comprises a flexible disk.

10. The sound source of claim 8, wherein the pair of flexible base plates each comprise at least one material selected from the group consisting of spring steel, aluminum, copper alloy, glass-fiber reinforced plastic, carbon-fiber reinforced plastic, and combinations there.

11. The sound source of claim 8, wherein each of the pair of flexible base plates further comprises a spacer disposed between the spring and the corresponding one of the pair of flexible base plates, such that the spring is indirectly coupled to the corresponding one of the pair of flexible base plates.

12. The sound source of claim 11, wherein the spacer comprises a disk, wherein the spring comprises a disk, and wherein the mass element comprises an annular disk coupled at a perimeter of the spring.

13. The sound source of claim 8, wherein the spring comprises a disk, wherein the mass element comprises an annular disk coupled at a perimeter of the spring.

14. The sound source of claim 8, wherein the pair of flexible base plates each comprise a piezoelectric body coupled to corresponding one of the flexible base plates.

15. The sound source of claim 8, wherein the gap is filled with air.

16. The sound source of claim 8, further comprising a ring that couples the flexible base plates to one another at outer edges of the pair of flexible base plates.

17. The sound source of claim 16, wherein the ring comprises a ring body and an inner extension, wherein the inner extension extends from the ring body between the outer edges of the pair of flexible base plates.

18. An apparatus comprising:
   a plurality of sound sources arranged in a stack, wherein the sound sources each comprise a pair of flexible base plates configured to bend and generate acoustic energy, wherein the pair of flexible base plates are spaced to provide a gap between their respective inner surfaces, wherein each of the flexible base plates comprises:
   a spring coupled to an inner surface of the corresponding one of the flexible base plates; and
   a mass element coupled to the spring, wherein the spring and the mass element are located in the gap between the pair of flexible base plates;
   wherein the plurality of sound sources are operable to produce at least two resonance frequencies in the apparatus, wherein at least one of the two resonance frequencies is about 10 Hz or lower at a depth of the sound source in a body of water of from about 0 meters to about 120 meters.

19. The apparatus of claim 18, wherein each of the flexible base plates further comprises a spacer disposed between the spring and the corresponding one of the flexible base plates, such that the spring is indirectly coupled to the corresponding one of the flexible base plates.

20. A sound source comprising:
   a base plate configured to bend and generate acoustic energy;
   a spring coupled to the base plate;
   a mass element coupled to the spring; and
   a spacer disposed between the spring and the base plate, such that the spring is indirectly coupled to the base plate, wherein the spacer comprises a disk, wherein the spring comprises a disk, and wherein the mass element comprises an annular disk coupled at a perimeter of the spring, wherein the sound source is operable to produce at least two resonance frequencies in the sound source.

21. A sound source comprising:
   a base plate configured to bend and generate acoustic energy;
   a spring coupled to the base plate; and
   a mass element coupled to the spring, wherein the spring comprises a disk, wherein the mass element comprises an annular disk coupled at a perimeter of the spring, wherein the sound source is operable to produce at least two resonance frequencies in the sound source.

\* \* \* \* \*